(12) United States Patent
Lee et al.

(10) Patent No.: US 8,766,644 B2
(45) Date of Patent: Jul. 1, 2014

(54) APPARATUS AND METHOD FOR COMPENSATING FOR VOLTAGE DROP IN PORTABLE TERMINAL

(75) Inventors: Jong-Su Lee, Suwon-si (KR); Youn-Lea Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 448 days.

(21) Appl. No.: 12/575,130

(22) Filed: Oct. 7, 2009

(65) Prior Publication Data

US 2010/0102836 A1    Apr. 29, 2010

(30) Foreign Application Priority Data

Oct. 29, 2008  (KR) .................. 10-2008-0106490

(51) Int. Cl.
*G01R 31/02*   (2006.01)
(52) U.S. Cl.
USPC ............... 324/537; 324/750.01; 324/750.3
(58) Field of Classification Search
USPC ........................................................ 324/537
See application file for complete search history.

(56) References Cited

U.S. PATENT DOCUMENTS

| | | | | |
|---|---|---|---|---|
| 3,441,804 A | * | 4/1969 | Klemmer | 361/765 |
| 4,016,483 A | * | 4/1977 | Rudin | 323/354 |
| 4,484,213 A | * | 11/1984 | Franklin | 257/536 |
| 5,077,486 A | * | 12/1991 | Marson et al. | 205/728 |
| 5,473,262 A | * | 12/1995 | Yoshimatsu | 324/429 |
| 5,534,788 A | * | 7/1996 | Smith et al. | 324/431 |
| 6,037,749 A | * | 3/2000 | Parsonage | 320/132 |
| 6,411,109 B1 | * | 6/2002 | Hanson | 324/691 |
| 6,801,146 B2 | * | 10/2004 | Kernahan et al. | 341/122 |
| 2003/0080772 A1 | * | 5/2003 | Giacomini et al. | 324/771 |
| 2005/0123144 A1 | * | 6/2005 | Wallace | 381/56 |
| 2006/0032076 A1 | * | 2/2006 | Evanyk et al. | 34/96 |
| 2011/0275628 A1 | * | 11/2011 | Yamagishi et al. | 514/233.2 |

OTHER PUBLICATIONS

Kuphaldt, Tony, Lessons in Electric Circuits, vol. I-DC, Ohm's Law, Chapter 2, Open Book Project, http://www.ibiblio.org/obp/electricCircuits, 2006, p. 1-37.*

* cited by examiner

*Primary Examiner* — Thomas F Valone
(74) *Attorney, Agent, or Firm* — Jefferson IP Law, LLP

(57) ABSTRACT

An apparatus and method for determining a status of a power unit in a portable terminal are provided. The apparatus includes a power unit for supplying power to a internal circuit, a resistor located between the power unit and the internal circuit, and a voltage determination unit for determining an amount of a current consumption by the internal circuit by considering a difference between a first voltage between the power unit and the resistor and a second voltage between the resistor and the internal circuit, and for determining status information of the power unit by compensating for a voltage drop of the first voltage in accordance with the amount of the current consumption.

8 Claims, 4 Drawing Sheets

APPARATUS AND METHOD FOR COMPENSATING FOR VOLTAGE DROP IN PORTABLE TERMINAL

PRIORITY

This application claims the benefit under 35 U.S.C. §119(a) of a Korean patent application filed in the Korean Intellectual Property Office on Oct. 29, 2008 and assigned Serial No. 10-2008-0106490, the entire disclosure of which is hereby incorporated by reference.

BACKGROUND OF THE INVENTION

1. Field of the Invention

The present invention relates to an apparatus and a method for displaying a residual amount of a battery in a portable terminal. More particularly, the present invention relates to an apparatus and a method for displaying a status of a battery by compensating for a voltage drop in accordance with a current consumption.

2. Description of the Related Art

A portable terminal has a limited battery resource for easy portability. According to the limited battery resource, the portable terminal displays a status of a battery to a display unit by determining the status of the battery, i.e., the portable terminal determines the status of the battery as illustrated in FIG. 1 below.

FIG. 1 illustrates a block diagram for determining a voltage of a battery in a portable terminal according to a conventional art.

Referring to FIG. 1, the portable terminal comprises a battery 100, an internal circuit 110, and a voltage determination unit 120.

The battery 100 provides current for operating of the internal circuit 110 of the portable terminal. The internal circuit 110 operates through the current provided by the battery 100. The voltage determination unit 120 determines a voltage of the battery 100.

The portable terminal displays the voltage of the battery 100 determined by the voltage determination unit 120 to a display unit.

As set forth above, the portable terminal determines the voltage of the battery 100 by using the voltage determination unit 120. In this case, the voltage determined by the voltage determination unit 120 may be lower than an actual residual amount of the battery 100 due to current consumption resulting from the use of supplementary functions in the internal circuit 110.

To address this problem, the portable terminal compensates for the voltage determined by the voltage determination unit 120 using a voltage drop corresponding to execution of each supplementary function. Thus, the portable terminal needs to determine the voltage drop according to execution of each supplementary function in advance and save the voltage drop information.

However, even if the same supplementary function is executed in the portable terminal, each current consumption for the supplementary function varies according to the environment in which the supplementary function is being used so that the portable terminal may not precisely compensate for the voltage determined by the voltage determination unit 120.

In this case, the portable terminal may determine that the status of the battery 100 is insufficient so that the portable terminal may cut the power even through the residual amount of the battery 100 is enough.

SUMMARY OF THE INVENTION

An aspect of the present invention is to address at least the above-mentioned problems and/or disadvantages and to provide at least the advantages described below. Accordingly, an aspect of the present invention is to provide an apparatus and a method for determining a precise status of a battery in a portable terminal.

Another aspect of the present invention is to provide an apparatus and a method for compensating for a voltage drop in accordance with a current consumption in a portable terminal.

Yet another aspect of the present invention is to provide an apparatus and a method for determining a precise status of a battery in a portable terminal by compensating for a voltage drop in accordance with a current consumption.

Still another aspect of the present invention is to provide an apparatus and a method for determining a current consumption in a portable terminal by using a resistor inserted between a battery and an internal circuit.

In accordance with an aspect of the present invention, an apparatus for determining a status of a power unit in a portable terminal is provided. The apparatus includes a power unit for supplying power to an internal circuit, a resistor located between the power unit and the internal circuit, and a voltage determination unit for determining an amount of a current consumption by the internal circuit by considering a difference between a first voltage between the power unit and the resistor and a second voltage between the resistor and the internal circuit, and for determining status information of the power unit by compensating for a voltage drop of the first voltage in accordance with the amount of the current consumption In accordance with another aspect of the present invention, a method for determining a status of a power unit in a portable terminal is provided. The method includes determining a first voltage between a power unit and a resistor and a second voltage between the resistor and an internal circuit, determining an amount of a current consumption by the internal circuit by considering a difference between the first voltage and the second voltage determining the status of the power unit by compensating for a voltage drop of the first voltage in accordance with the amount of the current consumption, wherein the resistor is located between the power unit and the internal unit.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments the present invention will be more apparent from the following description taken in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

The following description with reference to the accompanying drawings is provided to assist in a comprehensive understanding of exemplary embodiments of the present invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Hereinafter, an apparatus and method for compensating for voltage drop in portable terminal will be described.

It is assumed that the portable terminal has a communication function. However, the present invention may also be applied to a portable terminal without a communication function.

Figure 1:
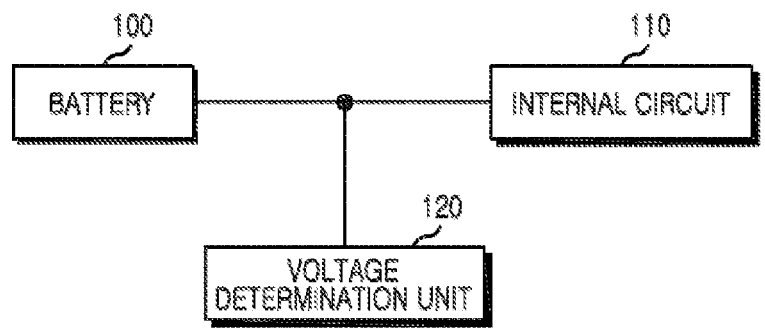
FIG. 1 illustrates a block diagram for determining a voltage of a battery in a portable terminal according to a conventional art.
Figure 2:
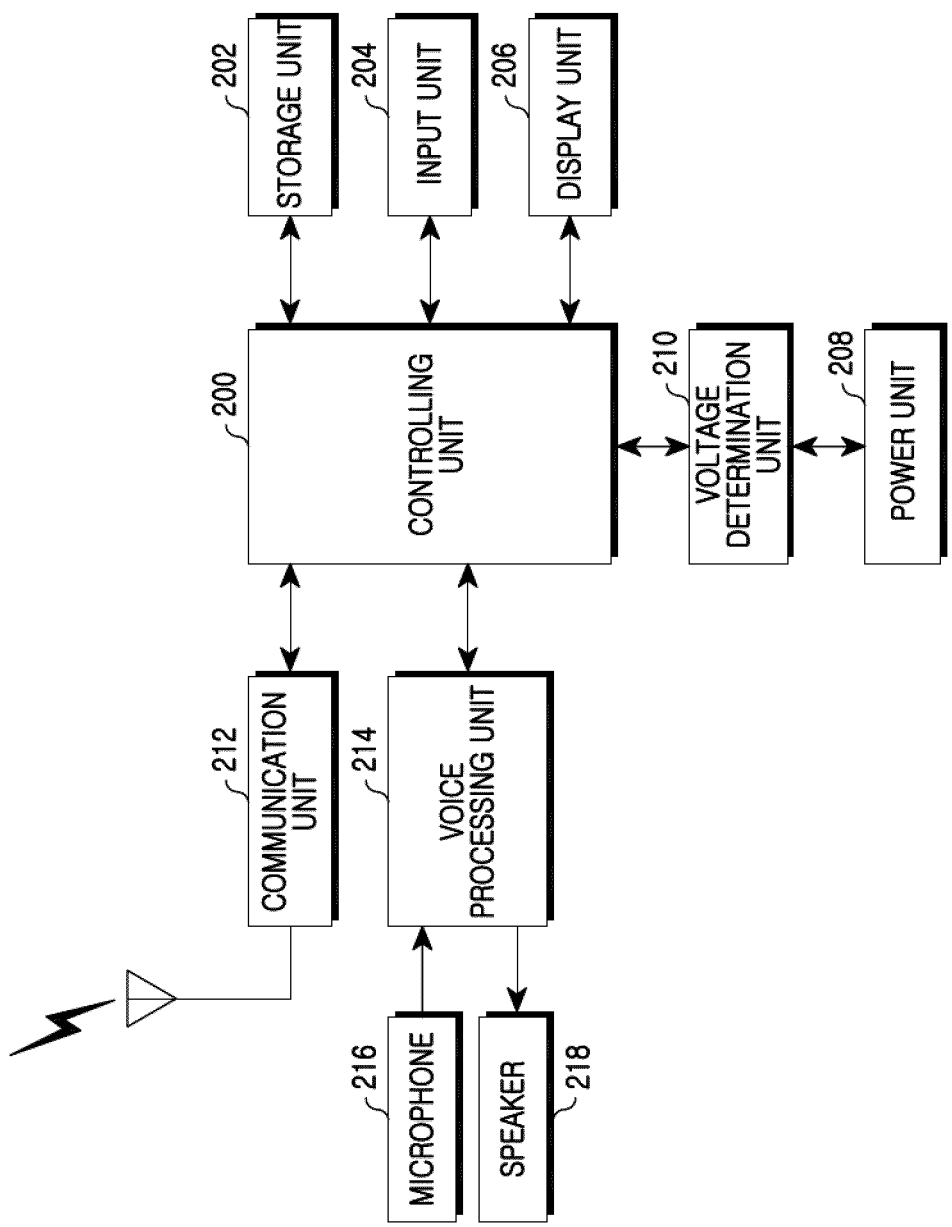
FIG. 2 illustrates a block diagram of a portable terminal according to an exemplary embodiment of the present invention.

The portable terminal comprises certain units illustrated in FIG. 2 to determine a status of a power unit.

FIG. 2 illustrates a block diagram of a portable terminal according to an exemplary embodiment of the present invention.

Referring FIG. 2, the portable terminal includes a controlling unit 200, a storage unit 202, an input unit 204, a display unit 206, a power unit 208, a voltage determination unit 210, a communication unit 212, a voice processing unit 214, a microphone 216 and a speaker 218.

The controlling unit 200 controls overall operations of the portable terminal, i.e., the controlling unit 200 processes and controls a voice call and data communications. Furthermore, the controlling unit 200 controls status information of the power unit 208 determined by the voltage determination unit 210 to be displayed at the display unit 206. Herein, the status information of the power unit 208 denotes a residual amount of a battery of the power unit 208.

The storage unit 202 stores programs for controlling overall operations of the portable terminal, data and system parameters temporarily being generated in program execution and other data for saving.

The input unit 204 provides data corresponding to a user's input to the controlling unit 200, i.e., the input unit 204 may include a keypad, a touch pad and an optical mouse, etc.

The display unit 206 displays, according to a control of the controlling unit 200, status information under operation of the portable terminal, characters inputted by a user, a moving picture, a still picture, and the like, i.e., the display unit 206 displays the status information of the power unit 208 determined by the voltage determination unit 210 according to the control of the controlling unit 200.

The power unit 208 provides power to internal circuits for activating the internal circuits which are included in the portable terminal. Herein, the power unit 208 denotes the battery of the portable terminal The voltage determination unit 210 determines a voltage of the power unit 208, that is, the voltage determination unit 210 determines an amount of a current consumption by the voltage of the power unit 208 and activation of the internal circuits.

Then, the voltage determination unit 210 determines the voltage of the power unit 208 by compensating for a voltage drop according to the amount of the current consumption in the determined voltage of the power unit 208.

The communication unit 212 processes a transmitted and received Radio Frequency (RF) signal through an antenna.

The voice processing unit 214 controls input and output of voice for voice communication using the microphone 216 and the speaker 218.

Figure 3:
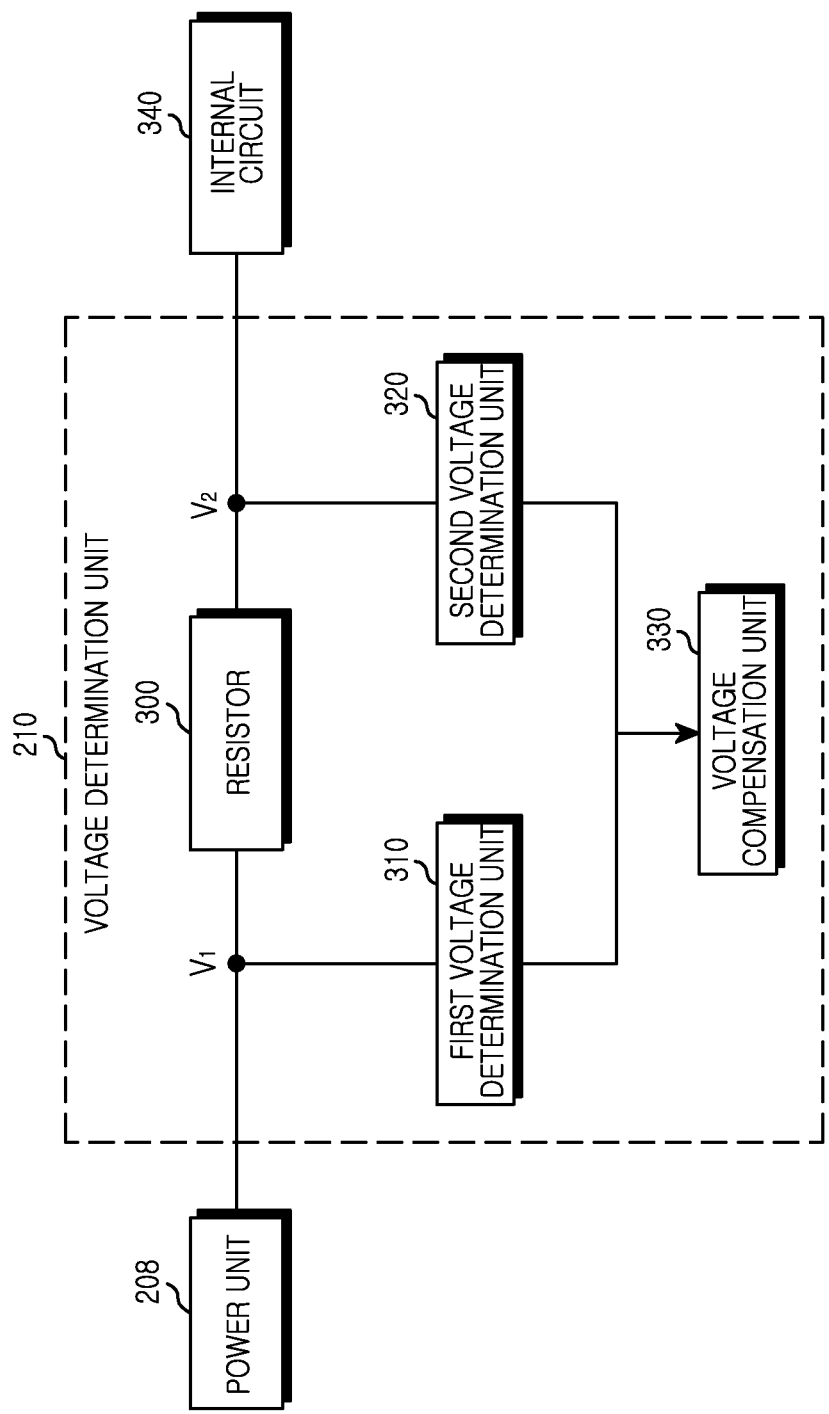
FIG. 3 illustrates a block diagram of voltage determination unit according to an exemplary embodiment of the present invention; and, FIG. 4 illustrates a procedure for displaying a status of a power unit in a portable terminal according to an exemplary embodiment of the present invention.

As set forth above, the portable terminal may determine the voltage of the power unit 208 by compensating for the voltage drop according to the current consumption using the voltage determination unit 210, i.e., the voltage determination unit 210 may comprise certain units as illustrated in FIG. 3 below.

FIG. 3 illustrates a block diagram of a voltage determination unit according to an exemplary embodiment of the present invention.

Referring FIG. 3, the voltage determination unit 210 includes a resistor 300, a first voltage determination unit 310, a second voltage determination unit 320 and a voltage compensation unit 330.

The resistor 300 is located between a power unit 208 and an internal circuit 340 of the portable terminal and creates a voltage drop that is proportional to the current consumed.

When a resistance value of the resistor 300 is too small, the voltage drop becomes too small and there is no significant voltage difference between a voltage determined by the first voltage determination unit 310 and a voltage determined by the second voltage determination unit 320.

Also, when a resistance value of the resistor 300 is too big, the voltage drop becomes too big and a voltage provided to the internal circuit 340 becomes too low. Thus, the resistor 300 has a resistance value which may include an amount of a current consumption. In an exemplary implementation, the resistor 300 has a resistance value from 10 mΩ to 20 mΩ for including a current consumption by activation of the internal circuit 340.

In an exemplary embodiment of the present invention, the resistor 300 may be a variable resistor of which a resistance value varies according to the current consumption. In an exemplary embodiment of the present invention, the resistor 300 comprises a plurality of resistors each of which has a different resistance value and can be used selectively according to the current consumed.

The first voltage determination unit 310 determines a first voltage $V_1$ between the power unit 208 and the resistor 300. In this case, the first voltage determination unit 310 includes an Analog to Digital Converter (ADC) which converts the first voltage, determined by the first voltage determination unit 310, between the power unit 208 and the resistor 300 into a digital value.

The second voltage determination unit 320 determines a second voltage $V_2$ between the resistor 300 and the internal circuit 340. In this case, the second voltage determination unit 320 includes an Analog to Digital Converter (ADC) which converts the second voltage, determined by the second voltage determination unit 320, between the resistor 300 and the internal circuit 340 to a digital value.

The voltage compensation unit 330 determines the current consumption using a difference between the first voltage and the second voltage, that is, the difference between the first voltage and the second voltage increases proportionally to the amount of current consumed in the internal circuit 340. Thus, the voltage compensation unit 330 may determine the amount of current consumed in the internal circuit 340 using the difference between the first voltage and the second voltage.

Then, the voltage compensation unit 330 determines a residual amount of a battery of the power unit 208 by compensating for the voltage drop of the first voltage according to the current consumption, i.e., the voltage compensation unit 330 determines the residual amount of the battery of the power unit 208 using the equation (1) below.

$$\text{Voltage} = [V_1 + (V_1 - V_2) \times R] \times \text{slope} \times \text{offset} \qquad (1)$$

In equation (1), Voltage denotes the residual amount of the battery of the power unit 208, $V_1$ denotes a digital value of the first voltage determined by the first voltage determination unit 310, $V_2$ denotes a digital value of the second voltage determined by the second voltage determination unit 320, R denotes a ratio for the voltage drop of the first voltage and a difference between the first voltage and the second voltage. Also, the slope and the offset denote the variables for converting a digital value of a voltage into an analog value.

The voltage compensation unit 330 determines the amount of the current consumption like $(V_1 - V_2) \times R$ using the difference between the first voltage and the second voltage. Then, the voltage compensation unit 330 determines the residual amount of the battery of the power unit 208 by compensating for the voltage drop according to the current consumption for the first voltage.

In an exemplary embodiment of the present invention, as set for above, the voltage determination unit 210 comprises the resistor 300, the first voltage determination unit 310, the second voltage determination unit 320 and the voltage compensation unit 330.

In an exemplary embodiment of the present invention, the voltage determination unit 210 may comprise the first voltage determination unit 310, the second voltage determination unit 320 and the voltage compensation unit 330. In this case, the resistor 300 comprises separate modules located external to the voltage determination unit 210.

Hereinafter, a method for displaying a status of the power unit 208 in the portable terminal will be described.

Figure 4:
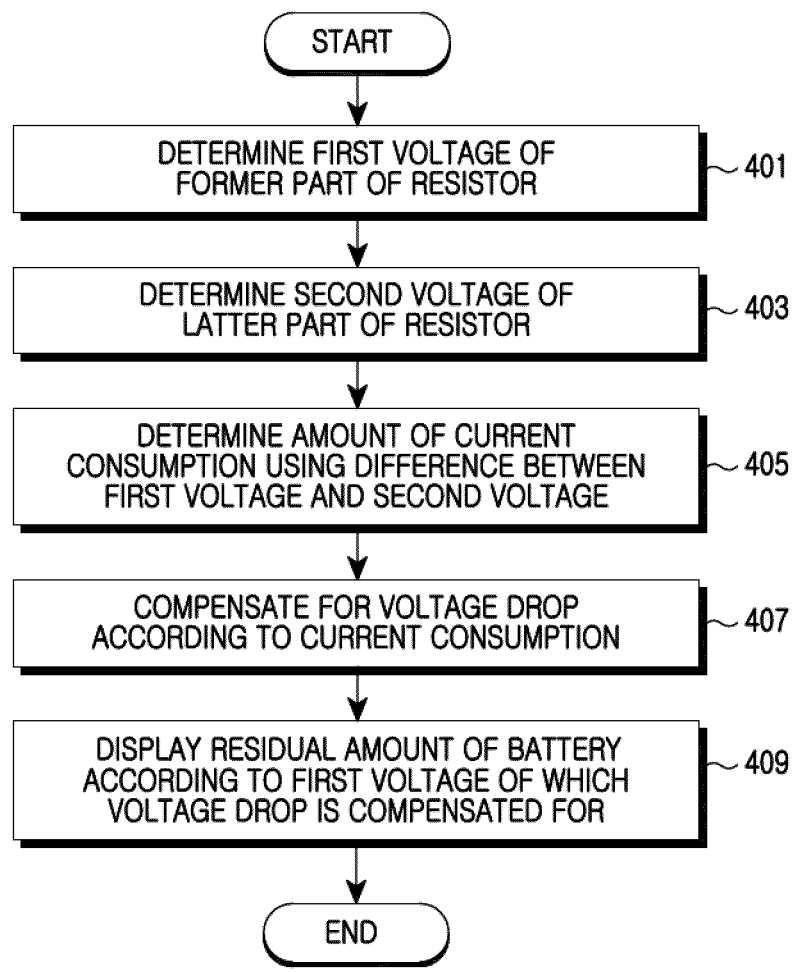

FIG. 4 illustrates a procedure for displaying a status of a power unit in a portable terminal according to an exemplary embodiment of the present invention.

Referring to FIG. 4, the portable terminal determines a voltage of a former part of a resistor in step 401, that is, the portable terminal determines the voltage between a power unit and the resistor, i.e., when the voltage determination unit 210 of the portable terminal comprises certain units as illustrated in FIG. 3, the voltage determination unit 210 determines the voltage between the power unit 208 and the resistor 300 using the first voltage determination unit 310. Hereinafter, the voltage between the resistor and the power unit will be referred to as the first voltage.

Also, the portable terminal determines a voltage of a latter part of the resistor in step 403, that is, the portable terminal determines the voltage between the resistor and an internal circuit, i.e., when the voltage determination unit 210 of the portable terminal comprises certain units as illustrated in FIG. 3, the voltage determination unit 210 determines the voltage between the resistor 300 and the internal circuit 340 using the second voltage determination unit 320. Hereinafter, the voltage between the resistor and the internal circuit will be referred to as the second voltage.

After the determination of the first voltage and the second voltage, the portable terminal determines an amount of a current consumption using a difference between the first voltage and the second voltage in step 405. The difference between the first voltage and the second voltage increases proportionally according to the amount of the current consumed by the internal circuit. Thus, the portable terminal may estimate the amount of the current consumption using the difference between the first voltage and the second voltage.

After the determination of the amount of the current consumed by the internal circuit, the portable terminal compensates for a voltage drop of the first voltage according to the amount of the current consumed in step 407.

In this case, the portable terminal recognizes the first voltage, compensated for the voltage drop according to the amount of the current consumption, as a remaining voltage of the power unit, i.e., the portable terminal determines the remaining voltage of the power unit by compensating for the voltage drop of the first voltage using the equation (1).

After the compensation for the voltage drop of the first voltage according to the amount of current consumption, the portable terminal displays information of the first voltage of which the voltage drop is compensated for to the display unit in step 409. That is, the portable terminal displays the residual amount of the battery according to the first voltage of which the voltage drop is compensated for to the display unit.

Then, the portable terminal ends the algorithm.

As set forth above, the portable terminal advantageously determines more precise status of the battery by determining the current consumption using the resistor inserted between the battery and the internal circuit and by compensating for the voltage drop according to the determination. Also, the portable terminal advantageously reduces an overhead of the storage unit by eliminating the need to save the voltage drop information of the supplementary function.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. An apparatus for determining a status of a power unit in a portable terminal, the apparatus comprising:
   an internal circuit;
   a power unit configured to supply power to the internal circuit;
   a variable resistor having a plurality of resistance values that are selected based on an amount of current consumption due to the portable terminal, the variable resistor located between the power unit and the internal circuit;

a first voltage measurement unit configured to measure a first voltage delivered to the variable resistor from the power unit;

a second voltage measurement unit configured to measure a second voltage from the variable resistor;

a voltage compensation unit configured to measure an amount of current consumption due to the variable resistor using a difference between the first voltage and the second voltage; and a display unit configured to display a residual amount of a battery of the power unit according to a sum of the first voltage and a product of the difference between the first voltage and the second voltage and an R, wherein the R denotes a ratio between a voltage drop according to the difference between the first voltage and the second voltage and the amount of current consumption due to the variable resistor.

2. The apparatus of claim 1, wherein the variable resistor comprises at least two resistors each of which has a different resistance value and one of the at least two resistors is selected and used in accordance with the amount of the current consumption by the internal circuit due to the portable terminal.

3. The apparatus of claim 1, wherein the plurality of resistance values comprises a range from 10 mΩ to 20 mΩ.

4. The apparatus of claim 1, wherein the residual power amount of the battery of the power unit is determined according to a voltage determined according to the following equation:

$$\text{Voltage} = [V_1 + (V_1 - V_2) \times R] \times \text{slope} \times \text{offset},$$

wherein Voltage denotes the residual amount of the battery of the power unit, $V_1$ denotes a digital value of the first voltage determined by the first voltage determination unit, $V_2$ denotes a digital value of the second voltage determined by the second voltage determination unit, R denotes a ratio between the voltage drop from the first voltage, and the difference between the first voltage and the second voltage, and the slope and the offset comprise variables for converting a digital value of a voltage into an analog value.

5. A method for determining a status of a power unit in a portable terminal, the method comprising:

determining a first voltage delivered to a variable resistor having a plurality of resistance values that are selected based on an amount of current consumption due to the portable terminal, and a second voltage from the variable resistor;

determining an amount of a current consumption due to the variable resistor using a difference between the first voltage and the second voltage;

determining a residual amount of a battery of the power unit according to a sum of the first voltage and a product of the difference between the first voltage and the second voltage and an R; and displaying the residual amount of the battery, wherein the variable resistor is located between the power unit and an internal circuit, and wherein the R denotes a ratio between a voltage drop according to the difference between the first voltage and the second voltage and the amount of current consumption due to the variable resistor.

6. The method of claim 5, wherein the variable resistor comprises at least two resistors each of which has a different resistance value and one of the at least two resistors is selected and used in accordance with the amount of the current consumption by the internal circuit.

7. The method of claim 5, wherein the plurality of resistance values comprises a range from 10 mΩ to 20 mΩ.

8. The method of claim 5, wherein the residual amount of the battery of the power unit is determined according to a voltage determined according to the following equation:

$$\text{Voltage} = [V_1 + (V_1 - V_2) \times R] \times \text{slope} \times \text{offset},$$

wherein Voltage denotes the residual amount of the battery of the power unit, $V_1$ denotes a digital value of the first voltage determined by the first voltage determination unit, $V_2$ denotes a digital value of the second voltage determined by the second voltage determination unit, R denotes a ratio between the voltage drop from the first voltage, and the difference between the first voltage and the second voltage, and the slope and the offset comprise variables for converting a digital value of a voltage into an analog value.

* * * * *